United States Patent [19]

Fong

[11] 3,842,370

[45] Oct. 15, 1974

[54] COAXIAL TRAPATT OSCILLATOR OPERABLE AT A FIXED FREQUENCY AND AT A HIGH EFFICIENCY

[75] Inventor: Timothy T. Fong, Los Angeles, Calif.

[73] Assignee: Hughes Aircraft Company, Culver City, Calif.

[22] Filed: Feb. 22, 1973

[21] Appl. No.: 334,551

[52] U.S. Cl. ............................ 331/101, 331/107 R
[51] Int. Cl. ............................................ H03b 7/14
[58] Field of Search....... 331/96, 101, 107 R, 107 G

[56] References Cited

OTHER PUBLICATIONS

Evans, IEEE Transactions on Microwave Theory and Techniques, Vol. MTT-17, December 1969, pp. 1,060–1067.

Kurokawa et al., Proceedings of the IEEE, January 1971, pp. 102–103.

*Primary Examiner*—Herman Karl Saalbach
*Assistant Examiner*—Siegfried H. Grimm
*Attorney, Agent, or Firm*—William J. Bethurum; W. H. MacAllister

[57] ABSTRACT

Disclosed is an improved and highly efficient coaxial TRAPATT oscillator and method for rapidly tuning same. The oscillator includes a TRAPATT diode connected directly between an outer coaxial conductor and a cylindrical quarter wave impedance transformer, and the transformer is in turn coaxially mounted directly between the TRAPATT diode and an inner coxial conductor of the oscillator. An end wall of the cylindrical impedance transformer is closely adjacent to the TRAPATT diode and it forms with the outer conductor a relatively large capacitance necessary for handling the TRAPATT diode displacement currents. Additionally, the geometry of the impedance transformer may be varied to control both this capacitance as well as the transformer impedance, $Z_T$, and the latter in turn determines the optimum delay angle for the oscillator. The impedance transformer provides, among other things, the three functions of: (1) impedance matching the TRAPATT diode to the coaxial oscillator circuitry, (2) providing Saalbach; Herman Karl relatively large gap capacitance, $C_g$, necessary for handling TRAPATT diode displacement currents, and (3) controlling the optimum delay angle, $\theta_d$, of the oscillator. The geometry and location of the step transformer with respect to the TRAPATT diode and the above coaxial conductors greatly improve the tunability of the oscillator.

6 Claims, 5 Drawing Figures

COAXIAL TRAPATT OSCILLATOR OPERABLE AT A FIXED FREQUENCY AND AT A HIGH EFFICIENCY

FIELD OF THE INVENTION

This invention relates generally to solid state microwave oscillators and more particularly to a trapped plasma avalanche triggered transit (TRAPATT) oscillator with improved tuning characteristics.

BACKGROUND

TRAPATT diodes and oscillators are generally well-known in the microwave semiconductor art. TRAPATT oscillators are presently useful, for example, as solid state microwave generators for a number of antenna applications. These include phased array radar antennas which use large numbers of TRAPATT oscillators. The solid state TRAPATT diode itself is a relatively new semiconductor device, being first reported in 1967 and being characterized by a much higher DC to RF conversion efficiency than was previously available using impact avalanche transit time (IMPATT) diodes. TRAPATT diode and oscillator operation is described in some detail by B. C. Deloach, Jr. et al, in "Device Physics of TRAPATT Oscillators," *IEEE Transactions on Electron Devices*, Vol. Ed–17, No. 1, January 1970, pages 9–21, and in some of the several references cited in this publication. TRAPATT oscillators are more efficient circuits than their IMPATT predecessors, and have in some instances replaced the latter in applications where high efficiency operation is required.

PRIOR ART

TRAPATT oscillators have been designed using coaxial waveguiding structures and mounting techniques which include connecting a TRAPATT diode in series with the inner coaxial conductor of the structure. Some impedance transforming means is usually coupled between the diode and the oscillator output for matching the diode impedance with that of the load. Further, a plurality of coaxial tuners are commonly positioned between inner and outer coaxial conductors of the oscillator for adjusting the load impedance of the oscillator for particular power and frequency operating requirements. An example of one such prior art coaxial TRAPATT oscillator is disclosed by W. J. Evans et al in an article entitled "Improved Performance of CW Silicon TRAPATT Oscillators," *Proceedings of the IEEE — Proceedings Letters*, May 1970, pages 845–846.

Generally speaking, all of the prior art coaxial TRAPATT oscillators known to me are plagued with the problem of tunability. In the past, the tuning of a TRAPATT oscillator has been dependent upon TRAPATT device parameter variations, such as variations in device breakdown voltage, device depletion layer width, device impurity doping density, and device junction capacitance. These parameters frequently vary from device to device, and the latter is true even with TRAPATT diodes selected from the same process fabrication batch. Thus, since each TRAPATT oscillator produced must be tediously tuned to a particular frequency, it has been extremely difficult to rapidly mass-produce TRAPATT oscillators of the same frequency, power output, and DC to RF conversion efficiency. These prior art coaxial TRAPATT oscillators require time-consuming adjustments of coaxial tuning stubs thereon in order to set the desired operating frequency of each TRAPATT oscillator. Such adjustments are time-consuming and frequently require highly skilled personnel who understand the nature of TRAPATT operation.

THE INVENTION

One general purpose of this invention is to provide a new and improved TRAPATT oscillator which includes most, if not all, of the advantages of similarly employed TRAPATT oscillators and yet simultaneously overcomes the above problems of tunability. Another general purpose of the invention is to provide a TRAPATT oscillator which exhibits a DC–RF conversion efficiency higher than that of any known state-of-the-art TRAPATT oscillators. To attain these purposes, a novel coaxial oscillator structure and TRAPATT diode mounting geometry therefor are provided, and this oscillator includes, in combination, an impedance transformer and TRAPATT diode connected directly in series between inner and outer coaxial conductors of the oscillator. The geometry and precise location of the diode and transformer closely control the optimum delay angle, $\theta_d$, for a highly efficient TRAPATT operation. This combination further controls the desired TRAPATT diode current density, $J_T$, and it still further controls the oscillator operating frequency. The step impedance transformer provides the two vital functions of controlling and setting $\theta_d$ and $J_T$ for maximum DC–RF conversion efficiency in addition to its primary function of matching the low impedance of the TRAPATT diode to the higher coaxial load impedance. With $\theta_d$ and $J_T$ closely controlled in this manner, one may calculate and predict the exact location on the coaxial structure at which a plurality of coaxial tuning stubs should be placed for establishing the proper load impedance for the most efficient TRAPATT operation. This load impedance thus sets the frequency, power output and DC–RF conversion efficiency of the oscillator, and these tuning conditions may be rapidly repeated from oscillator to oscillator. As a result, the present invention may be utilized in the mass production of large quantities of coaxial TRAPATT oscillators, each of which may be rapidly tuned to a single operating frequency. These oscillators may, in turn, be used in phased array radar antennas which require relatively large numbers of these oscillators tuned to a single CW operating frequency.

Accordingly, a primary object of the present invention is to provide a new and improved TRAPATT oscillator which may be easily and rapidly tuned to a desired operating frequency.

Another object is to provide an improved coaxial TRAPATT oscillator of the type described having a high DC to RF conversion efficiency.

Another object is to provide a TRAPATT oscillator of the type described which is relatively easy to fabricate, which is economical in construction, and which is well-suited for rapid fabrication at high yields.

A further object is to provide a TRAPATT oscillator of the type described which is compact in design, requires a minimum number of parts which are relatively easy to machine, and which is reliable and durable in operation.

DRAWINGS

DETAILED DESCRIPTION

Figure 1:
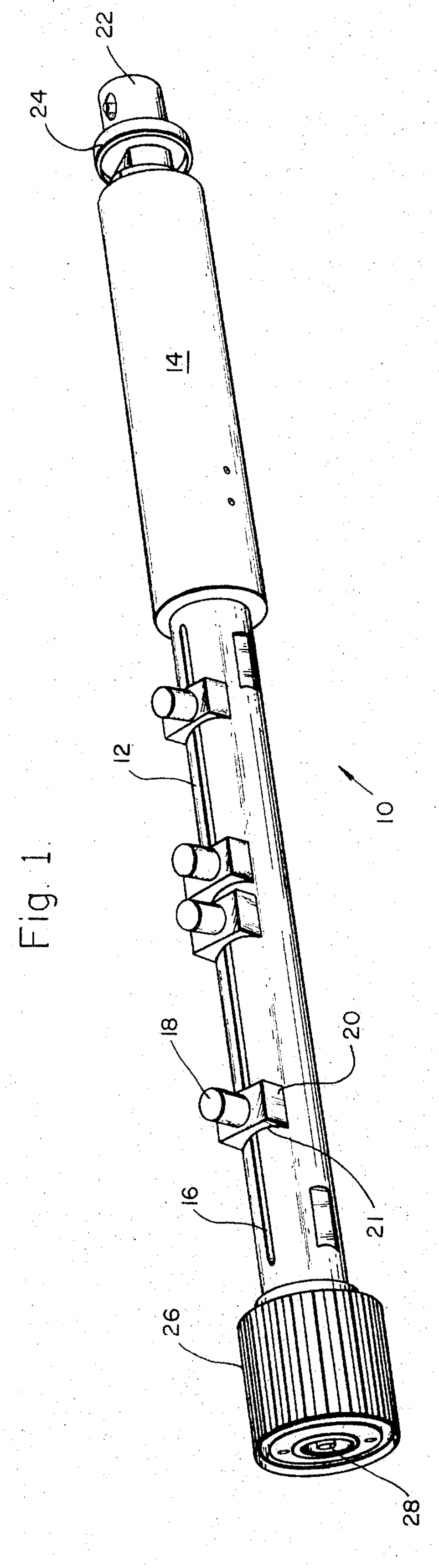
FIG. 1 is an isometric assembled view of the TRAPATT oscillator according to the invention.
Figure 2:
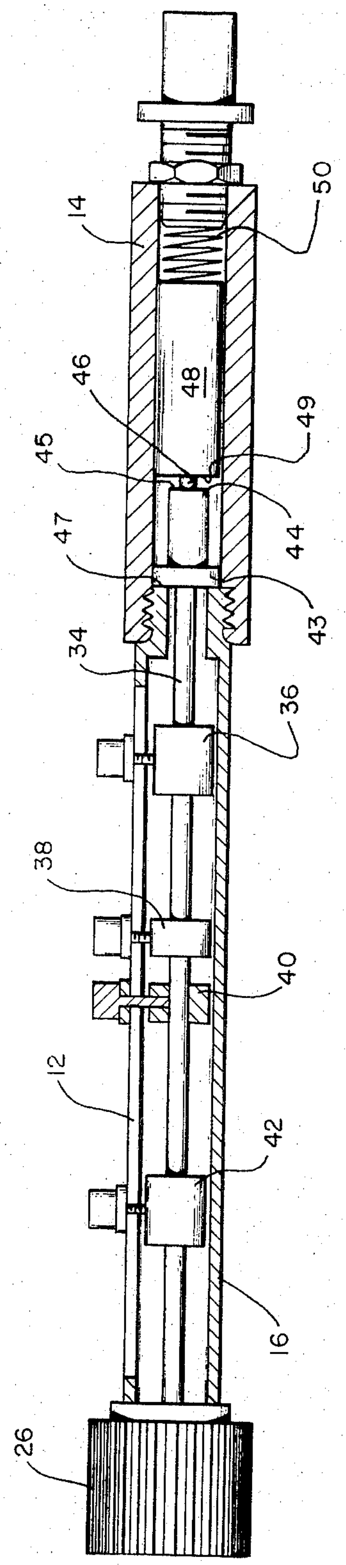
FIG. 2 is a cross-section view of the TRAPATT oscillator taken along line 2—2 of FIG. 1.

Referring now to FIGS. 1 and 2, there is shown an assembled TRAPATT oscillator, generally designated 10, which includes a first elongated coaxial section 12 and a second, shorter coaxial section 14 into which the longer section 12 is threadably fitted. The section 12 is part of the filter section of the oscillator 10, whereas the shorter section 14 of the oscillator is for the purpose of housing the step transformer and TRAPATT diode and for controlling the effective transformer impedance, $Z_T$, as will be described.

The filter section 12 includes an elongated slit 16 therein; and a plurality of coaxial tuning stubs (36, 38, 40, and 42 in FIG. 2) are threaded through this slit 16 to a plurality of frequency adjustment screws 18. These screws 18 are used to adjustably position the coaxial tuning stubs in FIG. 2 during the tuning of the TRAPATT oscillator 10 to a particular operating frequency. Each of the tuning screws 18 passes through and is supported by a separate header 20 having a lower curved surface 21 which rests flush with the outer surface of the coaxial housing 12. The tuning screws 18 may be loosened and the headers 20 moved longitudinally along the elongated slit 16 to set the coaxial tuning stubs at a precise desired location to give a corresponding desired shunt capacitance for the oscillator load impedance. This adjustment sets the particular operating frequency for the oscillator 10.

One end of the shorter coaxial section 14 fits into a power supply connector 22 which carries a socket flange or fitting 24 thereon, both being of conventional coax construction. An output connector 26 is threadably fitted as shown on one end of the longer coaxial section 12, and this connector includes a central microwave power output port 28. This output connector is also of conventional construction and therefore is not shown or described in further detail. The structure illustrated in FIGS. 1 and 2 is fabricated of a suitable metal, such as aluminum, and the tuning stubs 36, 38, 40, and 42 are preferably machined from anodized aluminum.

Referring now to FIG. 2 there is shown the inner coaxial conductor 34 of the oscillator 10 which, when assembled, is centrally positioned within the outer coaxial section 12; the center conductor 34 carries thereon in slidable engagement a plurality of tuning stubs 36, 38, 40, and 42, as previously described. A cylindrical step transformer 44 is electrically joined at one end of the inner conductor 34 by means of a cylindrical sleeve or flange member 43 which, when the structure is assembled, fits snugly against the cylindrical end surface 47 of the longer coaxial section 12. This flange 43 is composed of material premitting passage of electromagnetic waves and does not present a significant impedance as is indicated in the equivalent circuit of FIG. 3. Furthermore, flange 43 prevents the inner coaxial conductor 34 from moving around inside the outer coaxial section 12 once the oscillator 10 has been assembled as shown in FIG. 2.

The impedance matching step transformer 44 has a cylindrical end wall surface 45 which is bonded in a conventional manner to one contact of the TRAPATT diode 46. The TRAPATT diode 46 is in turn die bonded at its other contact to one end surface 49 of a cylindrical aluminum header 48; and the header 48 is electrically part of the outer coaxial section 14 of the oscillator 10. That is, the cylindrical outer wall portion of the header 48 rests substantially flush with the inside wall portion of the coaxial section 14, so that the TRAPATT diode 46 is directly connected to the outer coaxial section 14.

The thickness of the diode 46 determines the spacing between the closely spaced walls 45 and 49 which define the parallel plates of the diode's gap capacitance, $C_g$, and this thickness is typically on the order of 0.025 inch. The capacitance, $C_g$, is necessary for handling relatively large diode displacement currents, as will be described below. A coil spring 50 fits into the right hand end of the outer coaxial section 14 as viewed in FIG. 2 and urges the header 48 and diode 46 against the step transformer 44, which in turn urges the cylindrical flange 43 against the cylindrical wall 47 of the coaxial section 12. This spring loading of the assembled oscillator 10 maintains the inner coaxial conductor 34 secure within the outer coaxial sections 12 and 14 of the oscillator.

Figure 3:
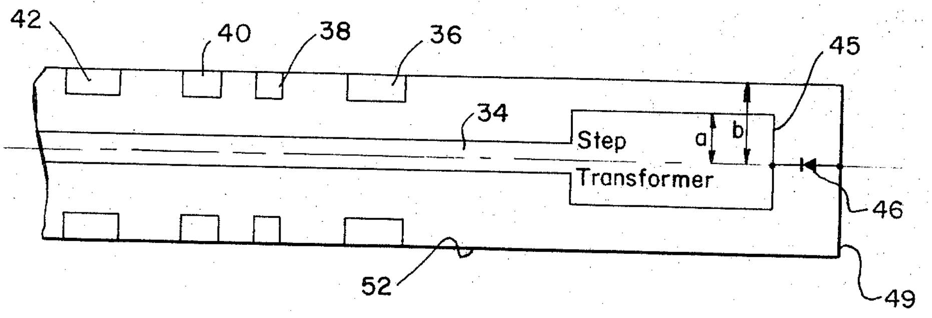
FIG. 3 illustrates the novel geometry of the combination: step transformer, TRAPATT diode, and inner and outer coaxial conductors of the oscillator in FIGS. 1 and 2.

Referring now to FIG. 3, there is illustrated the geometry, spacing and location of the novel structural combination comprising the impedance transformer 44, the TRAPATT diode 46, and the inner and outer coaxial conductors 34 and 52 of the oscillator 10. The outer coaxial conductor of the oscillator which is represented schematically as 52 electrically includes both of the hollow cylinders 12 and 14 and also the cylindrical header 48. The step transformer 44 simultaneously provides the following three functions during the operation of the above-described embodiment of the invention: (1) First, it provides its primary function of matching the low impedance of the TRAPATT device 46 to the high impedance of the coaxial line and the output load connected thereto. This is a desired condition for maximum power transfer and maximum DC–RF conversion efficiency. (2) Secondly, the low characteristic impedance, $Z_T$, of the step transformer 44 is used to control the delay time, $\tau_d$, and thus the delay angle, $\theta_d$, necessary to generate the avalanche shock wave in the diode 46 and consequently create a low impedance trapped plasma state therein. The relationships between these parameters are set forth below. The energy of the output pulses generated by the diode 46 is partially reflected from the vertical wall of the first tuning stub 36 back to the diode 46 and there it initiates and sustains the high efficiency TRAPATT operation of the diode 46. (3) Thirdly, the cylindrical end wall 45 of the step transformer 44 serves as one parallel plate of the relatively large gap capacitance, $C_g$, which is necessary for handling the relatively large displacement currents flowing in the TRAPATT diode 46. This large gap capacitance, $C_g$, also enhances the high efficiency operation of the oscillator, and as will be explained below, this parameter can be varied independently of the value of $Z_T$. Thus, the above novel structural combination establishes the optimum conditions for a high DC–RF conversion efficiency, and the resistance and reactance values of this structural combination are utilized in calculating the optimum loading conditions of the oscillator for the most efficient mode of TRAPATT operation. By examining similar optimum loading conditions for a number of these TRAPATT oscillators, certain tuning criteria are empirically determined; and these criteria are used in the rapid and repeated tuning of similar TRAPATT oscillators. This novel tuning process is developed below.

THEORETICAL CONSIDERATIONS

It can be demonstrated that for optimum and efficient oscillator performance, the delay time, $\tau_d$, and thus the delay angle, $\theta_d$, for the avalanche shock wave in the TRAPATT diode 46 are related to the impedance, $Z_T$, of the step transformer 44 by the following expression:

$$\theta_d = \omega_o \tau_d = (\pi^2/10)\ \omega_o C_o Z_T \tag{Eq. 1}$$

where $\omega_o$ is the fundamental TRAPATT frequency in radians/sec., $C_o$ is the depletion layer capacitance of diode 46 at avalanche breakdown, and $Z_T$ is the characteristic impedance of the step transformer 44.

In the actual circuit design, $\theta_d$ must be chosen consistent with the TRAPATT diode design. That is, $\tau_d$ is dependent upon certain internal electrical device characteristics of the TRAPATT diode 46 by the following expression:

$$\tau_d = (1/\theta)\ \ln\ [1 + \theta\ (\tau_d + t_t P\ \ln\ \theta/\theta_o)] \tag{Eq. 2}$$

where $\theta$ is a constant related to the total diode current density and the electron ionization rate in the diode 46, $t_t$ is the transit time delay of electrons travelling through the diode 46 at saturated velocity of the diode 46, P is the punchthrough factor of the diode 46, and $\theta_o$ is a constant related to the electron ionization rate of diode 46.

Therefore, the parameter $Z_T$ in Equation (1) above must be chosen to yield a desired value of $\tau_d$ in Equation (2) which will satisfy this latter equation as determined by the values of $\theta$, $\theta_o$, $t_t$ and P previously defined. These parameters are fixed by the electrical characteristics of the TRAPATT diode 46. The value of $\theta$ may be determined in accordance with the expression $$\theta = \lambda J_T/\epsilon \tag{Eq. 3}$$

where $\lambda$ is the ionization constant of the diode 46, $J_T$ is the total diode current density in the diode 46, and $\epsilon$ is the dielectric constant of the semiconductor material of diode 46. The value of $t_t$ may be determined by the expression $$t_t = \omega_d/2Vs \tag{Eq. 4}$$

where $\omega_d$ is the diode depletion layer width and $Vs$ is the saturated electron velocity of the diode 46.

The parameter $\theta_o$ is defined as $$\theta_o = \lambda/\epsilon \tag{Eq. 5}$$

and $\lambda$, the ionization constant of the diode 46, is related to the electron ionization rate, $\alpha$, in the diode 46 by the expression $$\alpha = A_o\ e^{E} \tag{Eq. 6}$$

where $A_o$ is a constant depending on the semiconductor material of diode 46 and E is the maximum electric field in the diode 46 at reverse breakdown. Therefore, equations (3) through (6) above may be used to determine the value of $\tau_d$ in Equation 2 for the maximum DC-RF conversion efficiency in the diode 46. Then, substituting this value of $\tau_d$ in Equation 1 yields a corresponding value of $Z_T$ for the step transformer 44.

When the above value of $Z_T$ has been determined, the ratio $b/a$ in FIG. 3 may be chosen to precisely yield this value of $Z_T$, where $b$ is the radial distance from the longitudinal axis of the transformer 44 to the outer conductor 52 and a is the radius of the transformer 44. That is:

$$Z_T\ \alpha\ b/a \tag{Eq. 7}$$

Having thus designed $Z_T$ to satisfy the requirements for an optimum $Y_d$ in accordance with Equations 1 and 2 above, it is desired to simultaneously provide a gap capacitance, $C_g$, of a magnitude sufficient to handle relatively large TRAPATT diode displacement currents. These currents flow in the oscillator circuit during the normal operation thereof, and they are proportional to the total TRAPATT diode current density, $J_T$, in accordance with the expression:

$$J_T = J_p + C\ (dV/dt) \tag{Eq. 8}$$

where $J_p$ is the diode particle current density, C is the total lumped capacitance near the TRAPATT diode 46, and V is the diode terminal voltage. Therefore, $C_g$ should be sufficiently large in its contribution to C in Equation 8 above to satisfy this equation, and the total lumped capacitance C can be controlled by increasing or decreasing $C_g$. The latter parameter is dependent upon its parallel plate surface areas 45 and 49, which in turn are directly proportional to $a^2$. Therefore, in providing a value of "$a^2$" and thus a gap capacitance, $C_g$, of a magnitude sufficient to satisfy the lumped capacitance C in Equation 8 above, care must be taken to insure that the ratio "$b/a$" will simultaneously yield a value of transformer impedance $Z_T$ that will satisfy Equations 1 and 2 above for optimum delay time $\tau_d$ and delay angle $\theta_d$.

Figure 4:
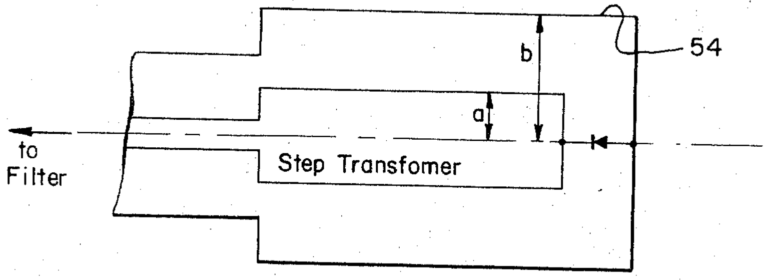
FIG. 4 is a schematic diagram illustrating an alternative construction for the outer coaxial conductor of the oscillator in order to provide an additional dimension of control over he impedance of the step transformer.

If the structure and geometry of FIG. 2 does not permit the microwave circuit designer to simultaneously satisfy the above requirements for $C_g$ and $Z_T$, the structural combination in FIG. 4 consisting of the step transformer 44 and outer coaxial conductor 54 may be utilized. This novel geometry permits a variation in the ratio "*b*/*a*," and thus provides an added dimension of control over $Z_T$, without changing either the "*a*" dimension or the gap capacitance, $C_g$. That is, by increasing or decreasing the b dimension, the impedance $Z_T$ can be increased or decreased without varying the value of gap capacitance $C_g$.

For high efficiency operation of the TRAPATT oscillator 10, the total impedance seen by the diode 46 must have certain properties. As will be explained below, these properties cannot be provided by the step transformer 44 alone; and for this reason a low pass filter comprising the previously described coaxial stubs 36, 38, 40, and 42 must be utilized. This filter provides a load impedance on the TRAPATT diode 46 that will simultaneously satisfy the necessary requirements for a high DC–RF conversion efficiency and a maximum power transfer in the oscillator 10 at a particular operating frequency. The load impedance necessary to satisfy these requirements has been emperically determined from a characterization process using a number of TRAPATT oscillators. This characterization process is described below.

The TRAPATT oscillator 10 in FIG. 1 was initially connected to a 50 ohm output load with the tuning stubs 36, 38, 40, and 42 disposed as shown on the inner coaxial connector 34. The initial positioning of these stubs was made using known standard Tschebychev filter design techniques. A chosen TRAPATT diode 46 was mounted in the oscillator circuit as previously described, and for a fundamental frequency, $f_o$, of the diode 46, the total load resistance and reactance seen by the diode 46 was varied while simultaneously measuring the power output and the DC–RF conversion efficiency of the oscillator 10. The total load reactance was varied by moving the tuning stubs 36, 38, 40, and 42 and the total load resistance was varied by varying $Z_L$ in FIG. 5. It was observed that at the TRAPATT diode's fundamental frequency $f_o$, the negative Q of the diode equals 1 and the maximum power output and maximum conversion efficiency of the oscillator 10 occur where the absolute values of the load resistance $R_{Lo}$ (at $f_o$) and reactance $X_{Lo}$ (at $f_o$ ) seen by the diode are approximately equal. That is, $$|R_{Lo}| = |X_{Lo}| \quad \text{(Eq. 9)}$$

where $X_{Lo}$ is capacitive. Furthermore, it was observed that for harmonics of $f_o$ up to the third harmonic, the maximum power output and the maximum conversion efficiency of the TRAPATT oscillator 10 occur where the load resistance $R_{Ln}$ seen by the diode 46 approaches zero and the total load reactance $X_{Ln}$ seen by the diode 46 approaches the value of the load reactance $X_{Lo}$ at the fundamental frequency times the number of the harmonic. That is, $$|R_{Ln}| = 0 \quad \text{(Eq. 10)}$$

and $$X_{Ln} = n\,|X_{Lo}| \quad \text{(Eq. 11)}$$

where $n$ is the harmonic number of the frequency $f_o$.

During the above characterization, it was also observed that for maximum power transfer and maximum conversion efficiency, the total load reactance $X_{Lo}$ seen by the diode 46 and the fundamental oscillator frequency $f_o$ was related to certain TRAPATT device parameters (defined below) in accordance with the expression $$X_{LO} = -\frac{qN_dW_d}{3.0J_{dc}}\omega_o P^2 \cdot \frac{1}{\omega_o C_o} \quad (12)$$

where $q$ is the electronic charge, $N_d$ is the impurity doping density of the TRAPATT diode 46, $W_d$ is the depletion layer thickness of the active region of the diode 46, $J_{dc}$ is the dc current density through the diode 46, $\omega_o$ is the fundamental TRAPATT frequency in radians per second, P is the punch-through factor of the diode 46 and $C_o$ is the depletion layer capacitance of the diode 46 at breakdown voltage. Therefore, by solving Equation 12 above and substituting $X_{Lo}$ in Equations 9 and 11 above, the values of $R_{Lo}$ and $X_{Ln}$ can be determined. These values of $R_{Lo}$, $X_{Ln}$, $R_{Ln}$ and $X_{Lo}$ were initial values used in the tuning procedure to be described. That is, the final values of these latter parameters will be slightly different from these original calculations made in accordance with Equations 9–12 above. But this initial information on the above parameters and provided by the observations for maximum power transfer and maximum DC–RF conversion efficiency with a 50 ohm load provide a set of initial tuning parameters for introduction into a computer. This computer is used in a well-known iterative tuning procedure for impedance matching the equivalent circuit of FIG. 5.

The above optimum impedance characterization was made without making any effort to tune the oscillator 10 other than selecting the original position of each stub using standard Tschebychev filter design techniques. These filter design procedures are well-known in the microwave art and are described in detail, for example, in *Microwaves, Filters, Impedance Matching Networks and Coupling Structures* by Mathaei, Young and Jones, McGraw-Hill, 1964. Instead of attempting to further tune the oscillator 10, trend variations in the output power and conversion efficiency of the oscillator were observed for a number of different TRAPATT diodes while varying the total load resistance $R_{Ln}$ and total load reactance $X_{Ln}$ seen by the diode 46. These observations were made for the diodes' fundamental frequencies and harmonics thereof up to the third harmonic. For these frequencies, the maximum power output and maximum DC–RF conversion efficiency occurred where the load impedances seen by the diode 46 approached the mathematical relationships expressed in Equations 9 through 12 above.

Figure 5:
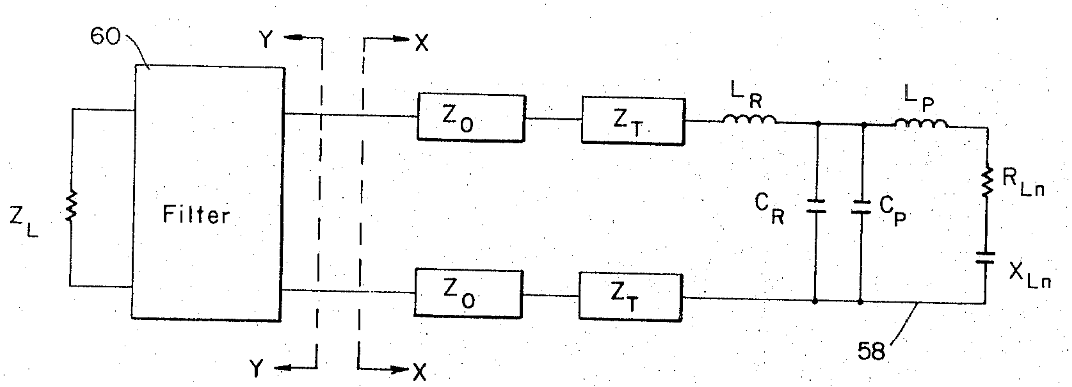
FIG. 5 is an equivalent circuit of the TRAPATT oscillator according to the invention.

With the latter relationships in mind, reference is now made to the equivalent circuit of FIG. 5 which is utilized in tuning the oscillator 10 and optimizing same for a high DC–RF conversion efficiency and an increased power transfer. This circuit includes the diode load resistance $R_{Ln}$ and diode load reactance $X_{Ln}$ at the diode output terminals 56 and 58, where $n$ is the number of the harmonic frequency, or the fundamental frequency. $X_{Ln}$ and $R_{Ln}$ are the diode reactance and resistance values when the above-described conditions for maximum power transfer and maximum DC–RF conversion efficiency are satisfied, $L_p$ represents certain measurable diode package parasitic inductance and $C_p$ represents certain measurable diode package parasitic capacitance. Additionally, $L_R$ is the radial mode inductance of the coaxial line in the vicinity of the step transformer 44, whereas $C_R$ is the radial mode parasitic capacitance at this location. The step transformer 44 has a characteristic impedance $Z_T$, whereas $Z_o$ is the coaxial line impedance to the right of the filter 60. Since the values of $R_{Ln}$ and $X_{Ln}$ have been previously determined in accordance with the preferred electrical characteristics of diode 46 as described above, and since $L_p$, $C_p$, $L_R$, $Z_T$, and $Z_o$ can be measured using well-known measurement techniques, then the value of $Z_{x-x} = R_{fn} + j X_{fn}$ looking to the right into the plane X — X can be calculated.

Now, using a 50 ohm termination for $Z_L$, the complex impedance $Z_{y-y}$ looking to the left into the Y — Y plane can be adjusted substantially equal to $Z_{x-x}$ in order to satisfy the condition for maximum power transfer and maximum DC–RF conversion efficiency. By using a computer and a well-known iterative tuning procedure, the positions of the stubs 36, 38, 40, and 42 are continuously changed until the values of $Z_{x-x}$ and $Z_{y-y}$ are made approximately equal in order to satisfy these above optimum operating conditions. Such procedure is carried out simultaneously for both fundamental and harmonic frequencies of the diode 46, and the positions of the four stubs 36, 38, 40, and 42 are continuously changed until the appropriate mean square error criteria is satisfied. This tuning technique employing a computer and an iterative tuning procedure to simultaneously force $Z_{x-x}$ to equal $Z_{y-y}$ for the fundamental frequency and the harmonics thereof is well-known in the microwave art and will, therefore, not be described in further detail herein.

With the filter 60 and step transformer 44 properly tuned and designed as described above, not only are the steady state load impedances seen by the TRAPATT device 46 at the fundamental and harmonic frequencies provided for efficient TRAPATT operation, but also the proper conditions for transient triggering of the TRAPATT diode 46 are provided, as mentioned above.

I claim;

1. An improved TRAPATT oscillator including in combination:

a. an inner conductor surrounded by a hollow outer conductor, said conductors being mounted in a predetermined spaced-apart relationship, b. a TRAPPATT diode electrically connected to said outer conductor, c. an impedance matching step transformer connected directly between said TRAPPATT diode and said inner conductor, said step transformer being substantially coaxial with said inner conductor and having a radial dimension thereof greater than the corresponding radial dimension of said inner conductor, said step transformer being operable to match the impedance of said TRAPATT diode with that of an oscillator load, as well as establish an optimum delay angle, $\theta_d$, for the shock wave generated by said TRAPATT diode, said step transformer further establishing a relatively high gap capacitance, $C_g$, for handling large displacement currents flowing in said TRAPATT diode, and d. a plurality of tuning stubs slidably mounted between said inner and outer conductors for establishing a low pass filter section of said oscillator, the positions of said stubs establishing a particular value of impedance seen by said TRAPATT diode which corresponds to a preselected frequency for said oscillator when operating at a maximum DC–RF conversion efficiency, said efficiency determined by the diode's internal electrical characteristics, the impedance of said step transformer, said gap capacitance $C_g$ and said delay angle $\theta_d$.

2. The oscillator defined in claim 1 wherein said impedance matching transformer is a step transformer of cylindrical shape and with an impedance, $Z_T$, which is proportional to its diameter, whereby said diameter may be controlled to in turn closely control $C_g$ as well as the optimum delay angle, $\theta_d$, for said oscillator, which is dependent upon $Z_T$.

3. The oscillator defined in claim 2 wherein the size of the cylindrical body forming said step transformer is selected to establish the gap capacitance, $C_g$, proportional to $A/d$, where A is the area of the end wall of the cylindrical body and $d$ is the gap spacing between said end wall and the outer conductor of said oscillator; the diameter of said cylindrical body also chosen to control and establish said optimum delay angle, $\theta_d$.

4. The oscillator defined in claim 3 wherein the step transformer impedance, $Z_T$, is controlled by the ratio $b/a$, where $b$ is the spacing between the longitudinal axis of said cylindrical body and said outer conductor and $a$ is the radius of said cylindrical body, whereby the dimension $b$ may be varied to independently control $Z_T$ without varying $C_g$.

5. A microwave coaxial oscillator having inner and outer substantially coaxial conductors operative for coupling microwave power to an external load, said oscillator including:

a. a high frequency negative resistance diode mounted on a header which is electrically connected to said outer coaxial conductor, said header having an end wall thereof forming one plate of a gap capacitance for said diode, b. an impedance matching step transformer electrically connected directly between said diode and said inner conductor of said oscillator and having an end wall which forms, with the end wall of said header, a parallel plate capacitor with a gap capacitance, $C_g$, for conducting relatively large displacement currents from said diode, and c. a plurality of tuning stubs slidably mounted between said inner and outer conductors for controlling the impedance seen by said diode, said oscillator may be frequency tuned by the movement of said stubs to ensure that said oscillator operates at a preselected frequency after the size of said transformer has been selected to provide the optimum delay angle and optimum conversion efficiency for said diode and said oscillator corresponding to said preselected frequency.

6. The oscillator defined in claim 5 wherein said diode is a TRAPATT diode with a fundamental frequency, $\omega_o$, in radians per second, which is the preselected frequency of said oscillator when said oscillator is operating at a maximum DC–RF conversion efficiency.

* * * * *